(12) United States Patent
Oh et al.

(10) Patent No.: US 7,498,217 B2
(45) Date of Patent: Mar. 3, 2009

(54) METHODS OF MANUFACTURING SEMICONDUCTOR MEMORY DEVICES WITH UNIT CELLS HAVING CHARGE TRAPPING LAYERS

(75) Inventors: Jung-Min Oh, Incheon (KR);
Jeong-Nam Han, Seoul (KR);
Chang-Ki Hong, Seongnam-si (KR);
Kun-Tack Lee, Suwon-si (KR);
Dae-Hyuk Kang, Hwaseong-si (KR);
Woo-Gwan Shim, Yongin-si (KR);
Jong-Won Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 130 days.

(21) Appl. No.: 11/746,761

(22) Filed: May 10, 2007

(65) Prior Publication Data
US 2007/0264793 A1 Nov. 15, 2007

(30) Foreign Application Priority Data
May 12, 2006 (KR) ...................... 10-2006-0043035

(51) Int. Cl.
*H01L 21/8238* (2006.01)
*H01L 21/8242* (2006.01)
*H01L 21/336* (2006.01)

(52) U.S. Cl. ...................... 438/201; 438/211; 438/248; 438/257; 438/263; 438/593; 257/E21.209; 257/E21.21; 257/E21.422; 257/E21.423; 257/E21.679

(58) Field of Classification Search .......... 257/E21.209, 257/E21.21, E21.422, E21.423, E21.679
See application file for complete search history.

(56) References Cited

U.S. PATENT DOCUMENTS

2006/0124988 A1 * 6/2006 Hur et al. .................... 257/315

FOREIGN PATENT DOCUMENTS

| JP | 2004-031893 | 1/2004 |
|---|---|---|
| KR | 1020030049781 A | 6/2003 |
| KR | 10-0529649 | 11/2005 |

* cited by examiner

*Primary Examiner*—Walter L Lindsay, Jr.
*Assistant Examiner*—Mohsen Ahmadi
(74) *Attorney, Agent, or Firm*—Myers Bigel Sibley & Sajovec

(57) ABSTRACT

In a method of manufacturing a semiconductor device such as a SONOS type semiconductor device, a trench is formed on a substrate. An isolation layer protruding from the substrate is formed to fill the trench. After a first layer is formed on the substrate, a preliminary second layer pattern is formed on the first layer. The preliminary second layer pattern has an upper face substantially lower than or substantially equal to an upper face of the isolation layer. A third layer is formed on the preliminary second layer and the isolation layer. A fourth layer is formed on the third layer. The fourth layer, the third layer, the preliminary second layer pattern and the first layer are partially etched to form a gate structure on the substrate. Source/drain regions are formed at portions of the substrate adjacent to the gate structure.

26 Claims, 11 Drawing Sheets

METHODS OF MANUFACTURING SEMICONDUCTOR MEMORY DEVICES WITH UNIT CELLS HAVING CHARGE TRAPPING LAYERS

CROSS-REFERENCE TO RELATED APPLICATION

This application claims priority under 35 U.S.C. § 119 to Korean Patent Application No. 2006-43035 filed on May 12, 2006, the contents of which are incorporated herein by references in its entirety.

FIELD OF THE INVENTION

Embodiments of the present invention relate to methods of manufacturing semiconductor devices and, more particularly, to methods of manufacturing semiconductor memory devices that include a plurality of unit cells.

BACKGROUND

Non-volatile semiconductor memory devices may be generally divided into floating gate type non-volatile semiconductor devices and charge trapping type non-volatile semiconductor devices based on the cell structure of the device. An example of a charge trapping type non-volatile semiconductor device is a silicon-oxide-nitride-oxide-semiconductor (SONOS) type non-volatile semiconductor device.

In floating gate type non-volatile semiconductor devices, a unit cell of the device typically includes a tunnel oxide layer, a floating gate, a dielectric layer and a control gate that are sequentially stacked on a substrate. Charges may be stored between the floating gate and the dielectric layer as free electrons in order to program a unit cell of the device. To erase the unit cell, the stored charges may be emitted from the floating gate and the dielectric layer. When defects are present in the tunnel oxide layer of floating gate type non-volatile semiconductor devices, charges stored between the floating gate and the dielectric layer may be dissipated from the floating gate. Accordingly, to reduce or minimize such charge loss, floating gate type non-volatile semiconductor devices may include a relatively thick tunnel oxide layer. However, as the thickness of the tunnel oxide layer is increased, the driving voltage of the device may be increased and/or the peripheral circuits may become more complicated. Thus, floating gate type non-volatile semiconductor devices that include a thick tunnel oxide layer may exhibit lower levels of integration.

A unit cell of a SONOS type non-volatile semiconductor device usually includes a tunnel insulation layer, a charge trapping layer, a blocking insulation layer and a gate electrode that are stacked on a substrate. The tunnel insulation layer and the blocking insulation layer may be formed using oxides, whereas the charge trapping layer is formed using nitride. The gate electrode may be formed using a conductive material. To program a SONOS type non-volatile semiconductor device, charges such as electrons may be stored in charge trapping sites of the charge trapping layer. The stored charges may be emitted from the charge trapping layer in order to erase the SONOS type non-volatile semiconductor device. Since the charges may be stored in charge trapping sites that have deep energy levels, the tunnel insulation layer may be relatively thin. When the tunnel insulation layer is thin, the SONOS type non-volatile semiconductor device may have a low driving voltage and simplified peripheral circuits. Thus, the SONOS type non-volatile semiconductor device may be highly integrated.

Recently, the SONOS type non-volatile semiconductor devices have been introduced that include charge trapping layers that are separated from each other by the unit cell so as to reduce or prevent lateral migration of the charges between adjacent charge trapping layers. These SONOS type non-volatile semiconductor devices may have improved threshold voltages.

Pursuant to conventional methods of manufacturing SONOS type non-volatile semiconductor devices, a tunnel insulation layer, a charge trapping layer, an etch stop layer and a mask layer are sequentially formed on a semiconductor substrate. The tunnel insulation layer and the charge trapping layer are formed using oxide and nitride, respectively. The mask layer is patterned to form a mask on the etch stop layer. The etch stop layer, the charge trapping layer and the tunnel insulation layer are partially etched using the mask so that a trench is formed through the tunnel insulation layer, the charge trapping layer and the etch stop layer. After the trench is filled with an insulation layer, the etch stop layer, the mask and an upper portion of the insulation layer are removed. Thus, an isolation layer is formed in the trench, and a tunnel insulation layer pattern and a charge trapping layer pattern are formed between adjacent isolation layers.

FIG. 1 is an electron microscopic photograph showing a trench formed in accordance with the above-described conventional method of manufacturing the SONOS type non-volatile semiconductor devices. As shown in FIG. 1, the trench may not have the desired structure because, during the etching of the charge trapping layer and the tunnel insulation layer, the etching rate of the charge trapping layer may be different from the etching rate of the tunnel oxide layer. When the trench has a poor structure, the isolation layer that is formed in the trench may include one or more voids. Further, the charge trapping layer pattern may be damaged during the etching process.

SUMMARY

Embodiments of the present invention provide methods of manufacturing semiconductor devices such as a SONOS type non-volatile semiconductor device that may have improved electrical characteristics.

Pursuant to certain embodiments of the present invention, methods of manufacturing semiconductor devices are provided in which a trench is formed in a substrate. An isolation layer may be formed in the trench so as to protrude from the substrate. A first layer may be formed on the substrate exposed by the isolation layer. A preliminary second layer pattern may be formed on the first layer. The preliminary second layer pattern may have an upper face that is at a level above the substrate that is substantially lower than, or substantially equal to, a level above the substrate of an upper face of the isolation layer. A third layer may be formed on the preliminary second layer and the isolation layer. A fourth layer may be formed on the third layer. The fourth layer, the third layer, the preliminary second layer pattern and the first layer may be partially etched to form a gate structure on the substrate. The gate structure may include a first layer pattern, a second layer pattern, a third layer pattern and a fourth layer pattern. Source/drain regions may be formed at portions of the substrate adjacent to the gate structure.

In some embodiments of the present invention, the first layer pattern, the second layer pattern, the third layer pattern and the fourth layer pattern may correspond to a tunnel insulation layer pattern, a charge trapping layer pattern, a blocking layer pattern and a gate electrode, respectively.

In some embodiments of the present invention, a thickness ratio between the first layer and the preliminary second layer pattern may be in a range of about 1.0:0.7 to about 1.0:7.5.

In some embodiments of the present invention, the trench and the isolation layer may be formed by forming a mask on the substrate, etching a portion of the substrate using the mask to form the trench, forming an oxide layer in the trench and on the mask, partially removing the oxide layer to expose the mask, and then removing the mask from the substrate. The mask may be formed by forming an oxide film on the substrate, forming a nitride film on the oxide film, and then partially etching the nitride and the oxide films to form the mask.

In some embodiments of the present invention, the first layer may be formed by a thermal oxidation process using an oxidizing agent that includes an oxygen-containing gas or a water vapor.

In some embodiments of the present invention, the preliminary second layer pattern may be formed by forming a second layer on the first layer and the isolation layer, and by partially removing the second layer to form the preliminary second layer pattern on the first layer only. The second layer may be formed using silicon nitride. A thickness ratio between the second layer and the preliminary second layer pattern may be in a range of about 1.0:0.1 to about 1.0:0.5.

In some embodiments, the second layer may be partially removed by a wet etching process using an etching solution that includes a phosphoric acid solution. The etching selectivity between the isolation layer and the second layer may be in a range of about 1:50 to about 1:100.

In other embodiments, the second layer may be partially removed by a dry etching process that includes a plasma etching process. In this process, the etching selectivity between the isolation layer and the second layer may be in a range of about 1:30 to about 1:200.

In still other embodiments, the second layer may be partially removed by a chemical mechanical polishing (CMP) process. The CMP process may be performed using a slurry composition that includes an abrasive containing metal oxide, silicon oxide or cerium oxide. The polishing selectivity between the isolation layer and the second layer may be in a range of about 1:20 to about 1:40.

In some embodiments of the present invention, the first layer may be formed using silicon oxide or silicon nitride. In some embodiments, the third layer may be formed using silicon oxide or metal oxide. Here, the third layer may be formed by a radical oxidation process, a chemical vapor deposition (CVD) process, a molecular beam epitaxial growth process, a sputtering process, an atomic layer deposition (ALD) process, etc. In some embodiments, the fourth layer may be formed using polysilicon or metal.

BRIEF DESCRIPTION OF THE DRAWINGS

The above and other features and advantages of the present invention will become more apparent by describing in detailed example embodiments thereof with reference to the accompanying drawings, in which.

DESCRIPTION OF EMBODIMENTS

Figure 1:
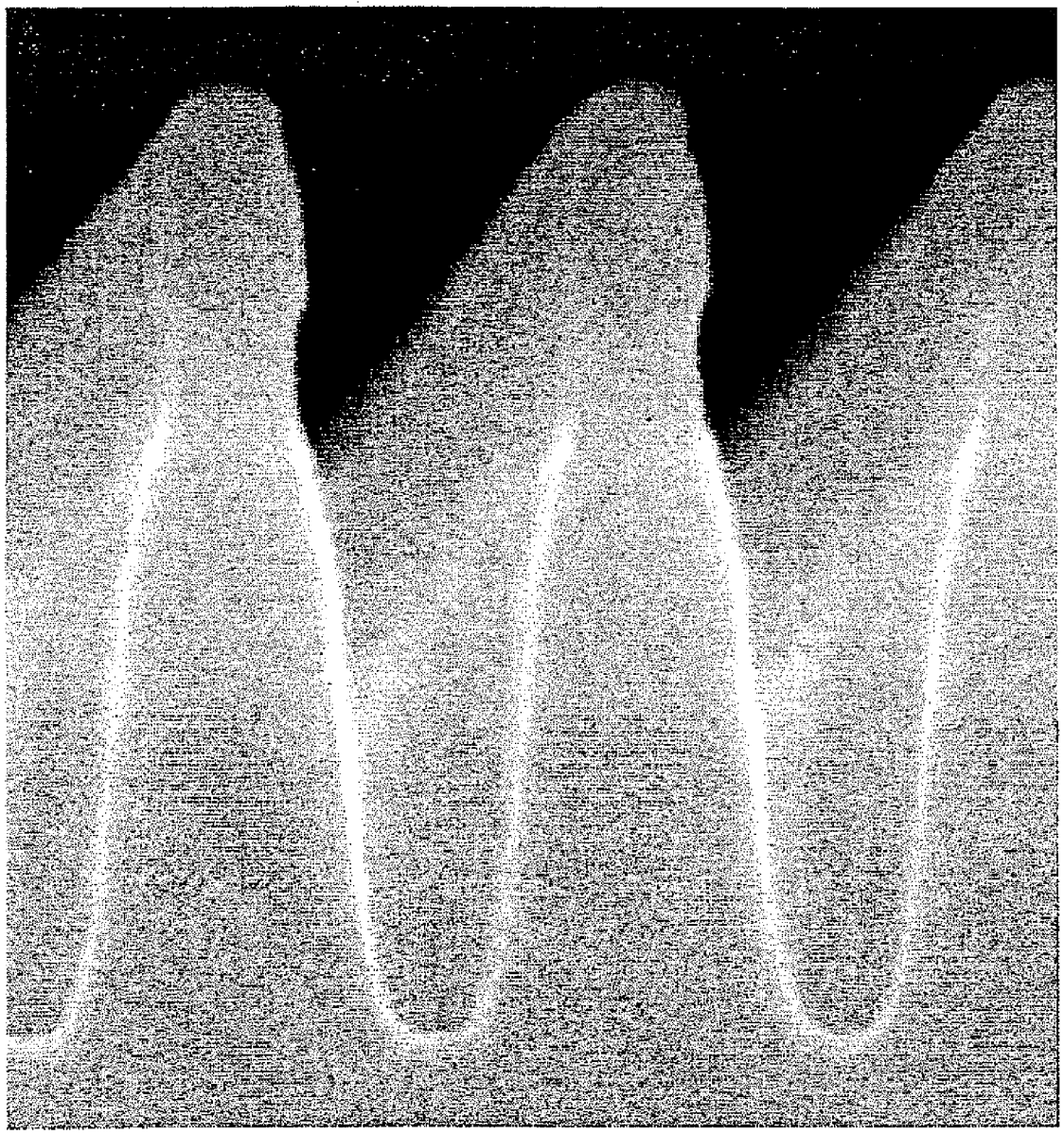
FIG. 1 is an electron microscopic photograph illustrating a trench formed in accordance with a conventional method of manufacturing SONOS type non-volatile semiconductor devices.

The present invention is described more fully hereinafter with reference to the accompanying drawings, in which embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, regions, layers and/or sections should not be limited by these terms. These terms are only used to distinguish one element, region, layer or section from another element, region, layer or section. Thus, a first element, region, layer or section discussed below could be termed a second element, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
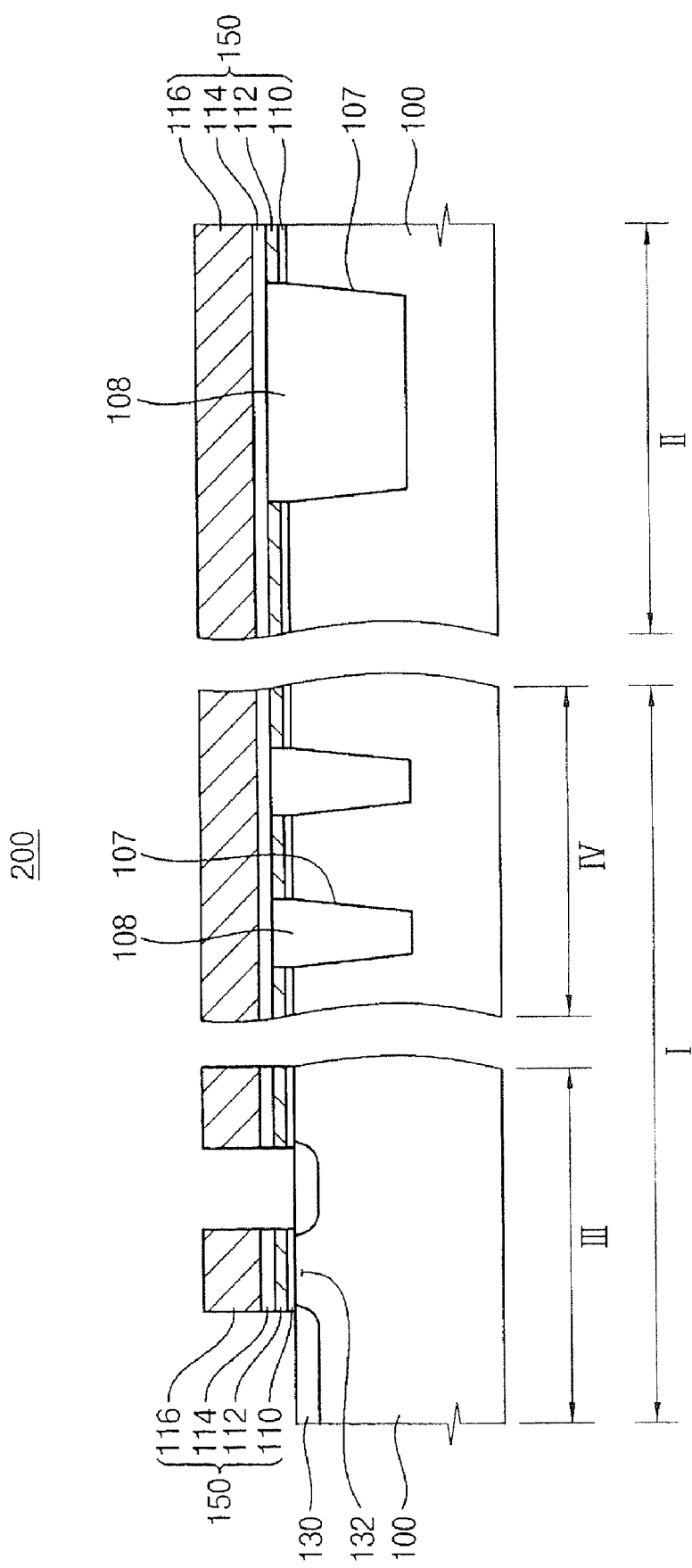
FIG. 2 is a cross-sectional view illustrating semiconductor devices in accordance with some embodiments of the present invention.

FIG. 2 is a cross-sectional view illustrating semiconductor devices in accordance with certain embodiments of the present invention. In FIG. 2, a reference numeral I designates cross-sections taken from a cell area of the semiconductor device, and a reference numeral II designates a cross-section taken from a peripheral circuit area of the semiconductor device. A reference numeral III denotes a cross-section of a first region of the cell area that is taken along a first direction, and a reference numeral IV represents a cross-section of a second region of the cell area that is taken along a second direction that is substantially perpendicular to the first direction. The cross-section of the peripheral circuit area II is taken along the second direction. Although a SONOS type non-volatile semiconductor device is illustrated in FIG. 2, the features of the present invention may be advantageously employed in other non-volatile semiconductor devices such as a floating gate type non-volatile semiconductor device, a floating trap type non-volatile semiconductor device, etc. Further, the features of the present invention may be employed in volatile semiconductor devices, e.g., a dynamic random access memory (DRAM) device, a static random access memory (SRAM) device, etc.

Referring to FIG. 2, a semiconductor device 200 includes a substrate 100 and a gate structure 150 as a unit cell thereof. Although only two gate structures 150 are depicted in FIG. 2, it will be appreciated that the semiconductor device may include a large number of units cells.

In some embodiments of the present invention, the substrate 100 may include a semiconductor (e.g., silicon, germanium, silicon-germanium, etc.) substrate, a silicon-on-insulator (SOI) substrate, a substrate having a thin film obtained by a selective epitaxial growth (SEG) process, etc. For example, in some embodiments, the substrate 100 may include a silicon substrate. In other embodiments, a substrate having a thin film formed by an SEG process may be used as the substrate 100 when, for example, the semiconductor device 200 corresponds to a SONOS type non-volatile semiconductor device having a stacked structure.

As illustrated in FIG. 2, source/drain regions 130 are disposed in the substrate 100 adjacent to the gate stricture 150. The source/drain regions 130 may be formed by implanting impurities into portions of the substrate 100 adjacent to the gate structure 150. The impurities may include elements in Group III or Group V of the periodic table of elements. For example, the source/drain regions 130 may include boron (B), phosphorus (P), arsenic (As), etc. In some embodiments, the source/drain regions 130 may be formed by an ion implantation process.

A channel region 132 may be formed in the substrate 100 between the source/drain regions 130. Thus, the channel region 132 may be provided at the portion of the substrate 100 beneath the gate structure 150.

When the semiconductor device 200 is a SONOS type non-volatile semiconductor device, the gate structure 150 may include a tunnel insulation layer pattern 110, a charge trapping layer pattern 112, a blocking insulation layer pattern 114 and a gate electrode 116.

The tunnel insulation layer pattern 110 may serve as an energy banner for tunneling of electrons. The tunnel insulation layer pattern 110 may comprise, for example, an oxide or an oxynitride. For example, the tunnel insulation layer pattern 110 may include silicon oxide or silicon oxynitride. In some embodiments, the tunnel insulation layer pattern 110 may be formed by a thermal oxidation process. In other embodiments, the tunnel insulation layer pattern 110 may be formed by a chemical vapor deposition (CVD) process.

The charge trapping layer pattern 112 may store electrons therein. The charge trapping layer pattern 112 may include a nitride such as silicon nitride. The charge trapping layer patterns 112 of adjacent unit cells may be separated from each other. Thus, horizontal movement of the electrons stored in adjacent charge trapping layer patterns 112 may be reduced or prevented. In some embodiments, the charge trapping layer pattern 112 may be formed after the etching process that is used to form an isolation layer 107. Hence, the charge trapping layer pattern 112 may not be damaged in the etching process so that desired charge trapping characteristics of the charge trapping layer pattern 112 may be sufficiently ensured.

The blocking insulation layer pattern 114 may prevent a voltage applied from the gate electrode 116 from being applied to the charge trapping layer pattern 112. The blocking insulation layer pattern 114 may include an oxide. For example, the blocking insulation layer pattern 114 may include silicon oxide.

The gate electrode 116 is disposed on the blocking insulation layer pattern 14. Since a voltage for driving the semiconductor device 200 may be applied to the gate electrode 116, the gate electrode 116 may include a conductive material. In some embodiments, the gate electrode 116 may include polysilicon doped with impurities. In other embodiments, the gate electrode 116 may include a metal having a work function greater than about 4.0 eV.

The gate structure 150 according to some SONOS type non-volatile semiconductor device embodiments of the present invention includes the tunnel insulation layer pattern 110, the charge trapping layer pattern 112, the blocking insulation layer pattern 114 and the gate electrode 116. Since the lateral migration of the electrons between adjacent charge trapping layer patterns 112 may be reduced or prevented, the semiconductor device 200 may have improved electrical characteristics. Additionally, the charge trapping layer pattern 112 not be exposed and subject to damage during the formation of the isolation layer 107. As a result, the semiconductor device 200 may have enhanced electrical characteristics and reliability.

A writing operation and an erasing operation of the semiconductor device 200 having the unit cell that includes the gate structure 150 will now be described with reference to the accompanying drawings.

A writing operation may be used to store information in a unit cell of the semiconductor device 200. During the writing operation, the substrate 100 may be set to a ground potential, while a positive voltage (Vg>0) is applied to the gate electrode 116 of the gate structure 150. An electric field may be generated from the gate electrode 116 toward the substrate 100 so that a Fouler-Nordheim current may pass from the gate electrode 116 to the substrate 100 through the tunnel insulation layer pattern 110. Accordingly, electrons passing through the channel region 132 between the source/drain regions 130 may overcome the energy barrier of the tunnel insulation layer pattern 110 and tunnel through the tunnel insulation layer pattern 110. The tunneled electrons may be stored in the charge trapping layer pattern 112. Migration of the electrons stored in the charge trapping layer pattern 112 toward the gate electrode 116 may be minimized or prevented by the energy barrier of the blocking insulation layer pattern 114. As a result, information may be stored in the unit cell of the semiconductor device 200 by trapping the electrons in the charge trapping layer pattern 112.

In order to erase a unit cell of the semiconductor device 200, the substrate 100 is grounded, and a negative voltage (Vg<0) is applied to the gate electrode 116 of the gate structure 150. An electric field may be generated from the substrate 100 toward the gate electrode 116, and thus a Fouler-Nordheim current may pass from the substrate 100 to the gate structure 116 through the tunnel insulation layer pattern 110. As a result, electrons stored in the charge trapping layer pattern 112 may overcome the energy barrier of the tunnel insulation layer pattern 110, and then the tunneled electrons may flow to the substrate 100, thereby erasing the stored information.

FIGS. 3 to 11 are cross-sectional views illustrating a method of manufacturing a semiconductor device in accordance with certain embodiments of the present invention. In FIGS. 3 to 11, a reference numeral I designates a cross-section of a cell area of the semiconductor device, and a reference numeral II designates a cross-section of a peripheral circuit area of the semiconductor device. A reference numeral III designates a cross-section of a first region of the cell area that is taken along a first direction, and a reference numeral IV designates a cross-section of a second region of the cell area taken along a second direction that is substantially perpendicular to the first direction. The cross-section of the peripheral circuit area designated by reference numeral II is taken along the second direction. Although FIGS. 3 to 11 illustrate a method of manufacturing a SONOS type non-volatile semiconductor device, it will be appreciated that in other embodiments the present invention the semiconductor device may comprise a different type of non-volatile semiconductor device such as a floating gate type non-volatile semiconductor device, a floating trap type non-volatile semiconductor device, etc. Additionally, the features of the present invention may likewise be used in volatile semiconductor devices such as, for example, DRAM devices, SRAM devices, etc.

Figure 3:
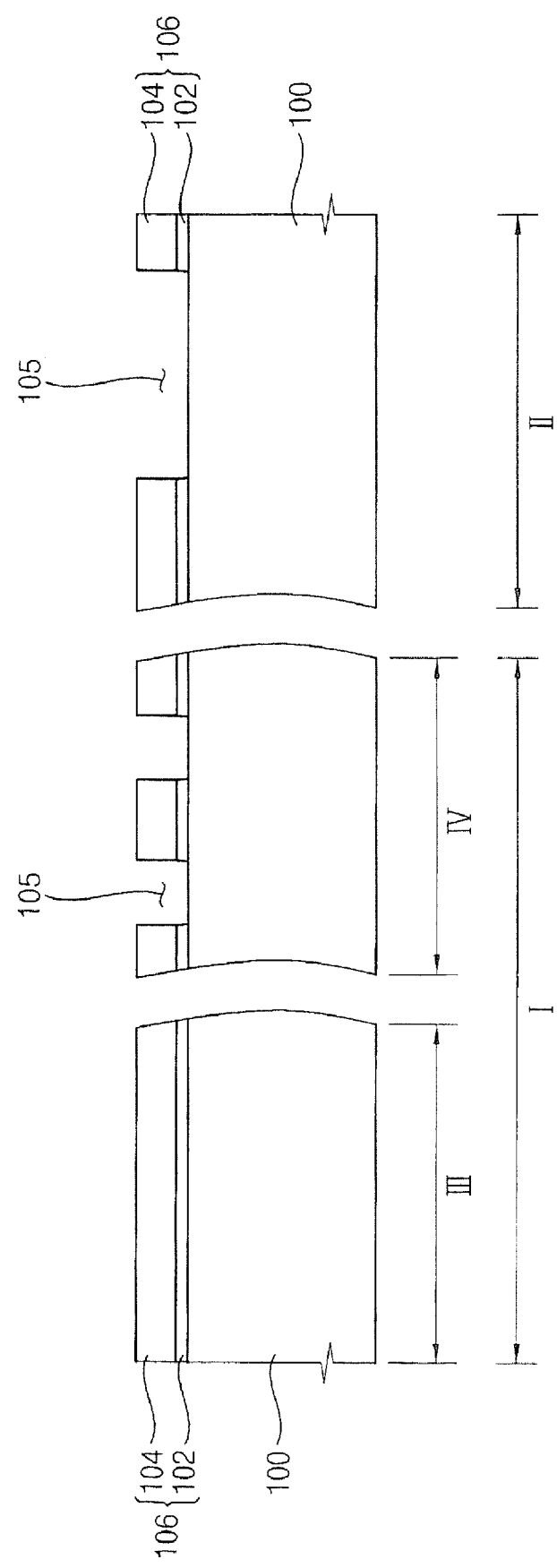
FIGS. 3 to 11 are cross-sectional views illustrating methods of manufacturing semiconductor devices in accordance with some embodiments of the present invention.

Referring to FIG. 3, a semiconductor substrate 100 having a cell area designated by reference numeral I and a peripheral circuit area designated by reference numeral II is prepared. The semiconductor substrate 100 may comprise an SOI substrate, a silicon substrate, a germanium substrate, a silicon-germanium substrate, a substrate having a thin film obtained by an SEG process, etc.

A mask layer (not illustrated) is formed on the semiconductor substrate 100. In some embodiments, the mask layer may be formed using a nitride such as silicon nitride. In other embodiments, the mask layer may have a multi-layered structure that includes an oxide film and a nitride film formed on the oxide film such as, for example, silicon oxide and silicon nitride films. In some embodiments, the oxide film may be formed by a thermal oxidation process or a CVD process to have a thickness of about 70 Å to about 100 Å. The oxide film may serve as a pad oxide film. Additionally, the nitride film may be formed, for example, by a low pressure chemical vapor deposition (LPCVD) process or a plasma-enhanced chemical vapor deposition (PECVD) process using a hexadichloro silane ($SiH_2Cl_2$) gas, a silane ($SiH_4$) gas and/or an ammonia ($NH_3$) gas. The nitride film may have a thickness of, for example, about 100 Å to about 300 Å. Thus, in certain embodiments of the present invention, the thickness ratio between the oxide film and the nitride film may be in a range of about 1.0:1.0 to about 1.0:4.3.

A photoresist pattern (not illustrated) may then be formed on the mask layer. The photoresist pattern may expose portions of the mask layer that overlie portions of the substrate 100 in which the trenches 107 are to be formed (see FIG. 4). In some embodiments, the photoresist pattern may have openings that partially expose the mask layer along the second direction.

The mask layer is then partially etched using the photoresist pattern as an etching mask to form a mask 106 on the semiconductor substrate 100. The mask 106 has openings 105 exposing portions of the semiconductor substrate 100 where the trenches 107 are to be formed. After forming the mask 106, the photoresist pattern may be removed from the mask 106 by, for example, an ashing process and/or a stripping process. In the embodiment illustrated in FIG. 3, the mask 106 includes an oxide film pattern 102 and a nitride film pattern 104. However, as noted above, in other embodiments the oxide film may be omitted and/or a different mask layer may be used.

Figure 4:
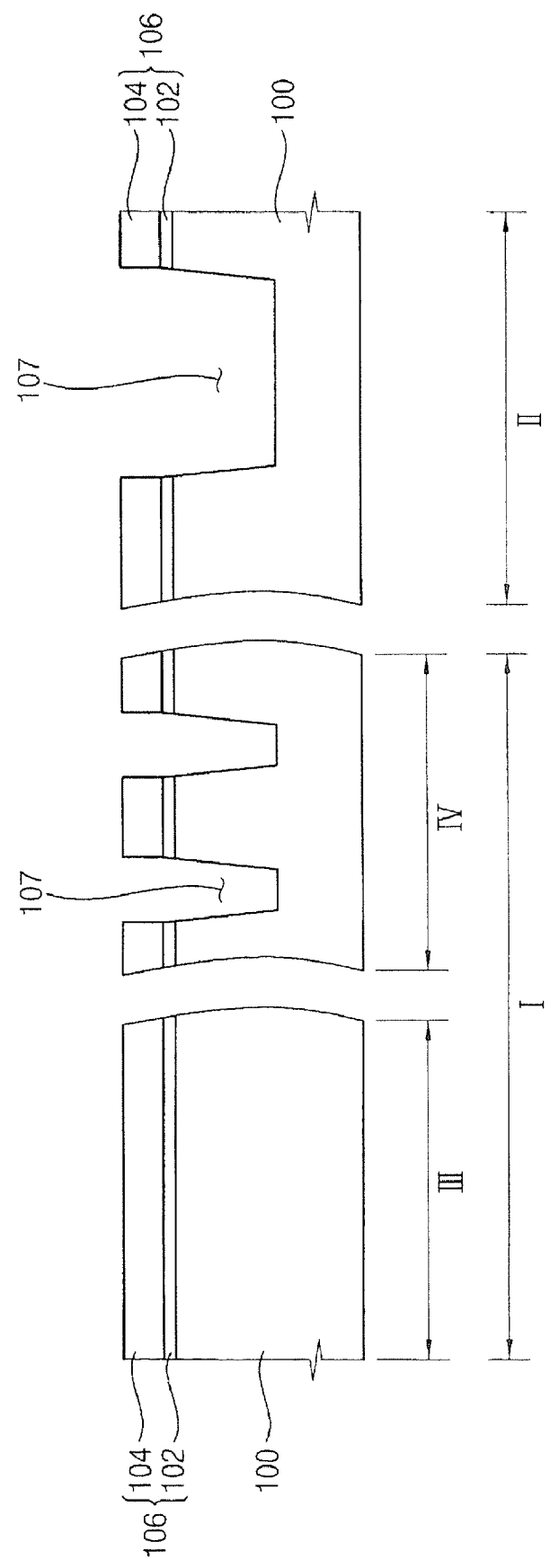

Referring to FIG. 4, the portions of the semiconductor substrate 100 exposed through the openings 105 of the mask 106 are etched using the mask 106 as an etching mask to form trenches 107 in upper portions of the semiconductor substrate 100 in the cell and the peripheral circuit areas I and II.

In some example embodiments of the present invention, an inner oxide layer may be formed on a sidewall of the trench 107 to cure damage to the semiconductor substrate 100 that may occur during the etching process that is used to form the trench 107. The inner oxide layer may comprise, for example, a silicon oxide layer formed by a thermal oxidation process.

In some embodiments of the present invention, a nitride liner may be formed on the sidewall and/or on the bottom of the trench 107 to minimize or prevent impurities from diffusing into the semiconductor substrate 100 though the trench 107. Such a nitride liner may be formed, for example, using silicon nitride during a subsequent CVD process.

Figure 5:
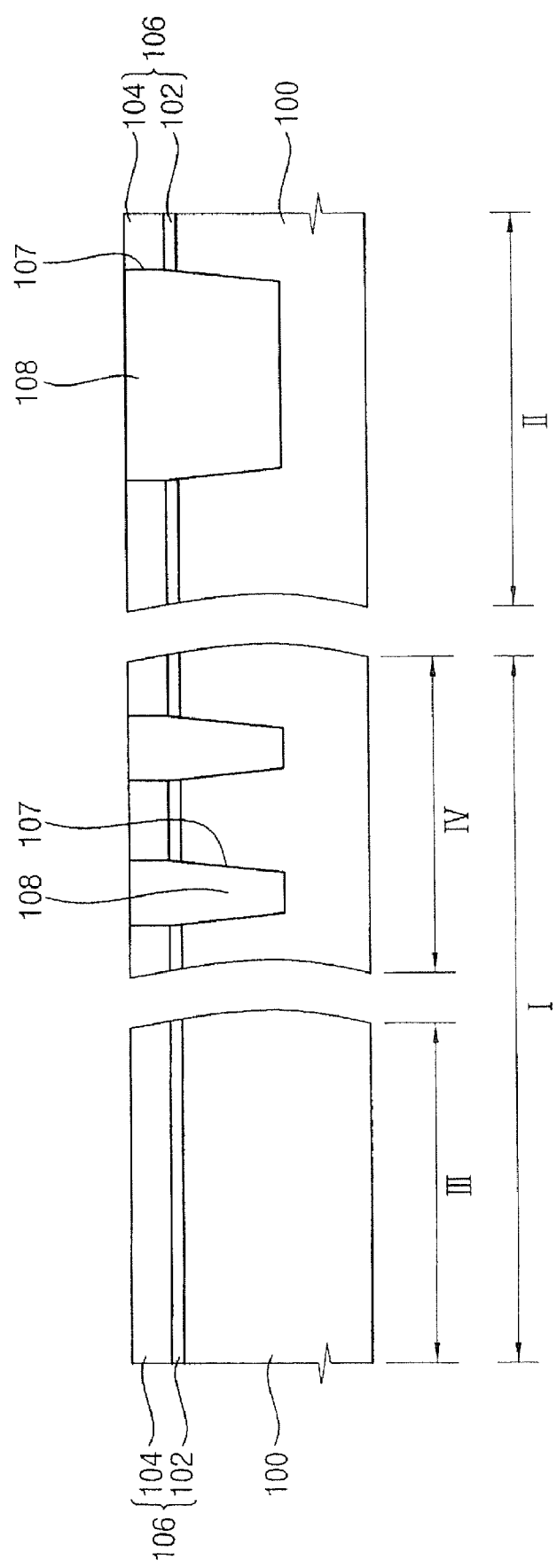

As illustrated in FIG. 5, isolation layers 108 may be formed in the trenches 107 that define field regions in the semiconductor substrate 100 and active regions therebetween.

In some embodiments of the present invention, an oxide layer (not illustrated) is formed on the mask 106 and in the trenches 107 to a thickness that is sufficient to fill the trenches 107 and the openings 105 of the mask 106. The oxide layer may be formed using, for example, silicon oxide. For example, the oxide layer may be formed using boro-phosphor silicate glass (BPSG), phosphor silicate glass (PSG), spin-on-glass (SOG), undoped silicate glass (USG), tetraethylorthosilicate (TEOS), plasma-enhanced-tetraethylorthosilicate (PE-TEOS), high density plasma-chemical vapor deposition (HDP-CVD) oxide, etc. The oxide layer may be formed by a spin coating process, a CVD process, a PECVD process, an HDP-CVD process, etc.

The oxide layer is partially removed to expose the mask 106 to form the isolation layers 108 in the trenches 107 in the cell and the peripheral circuit areas I and II. The oxide layer may be partially removed by, for example, a chemical mechanical polishing (CMP) process using a slurry composition that includes silica as an abrasive. In some embodiments, the isolation layers 108 (also referred to herein as an isolation pattern) in the cell area I may have a first width that is substantially narrower than a second width of the isolation layer 108 in the peripheral circuit area II.

Figure 6:
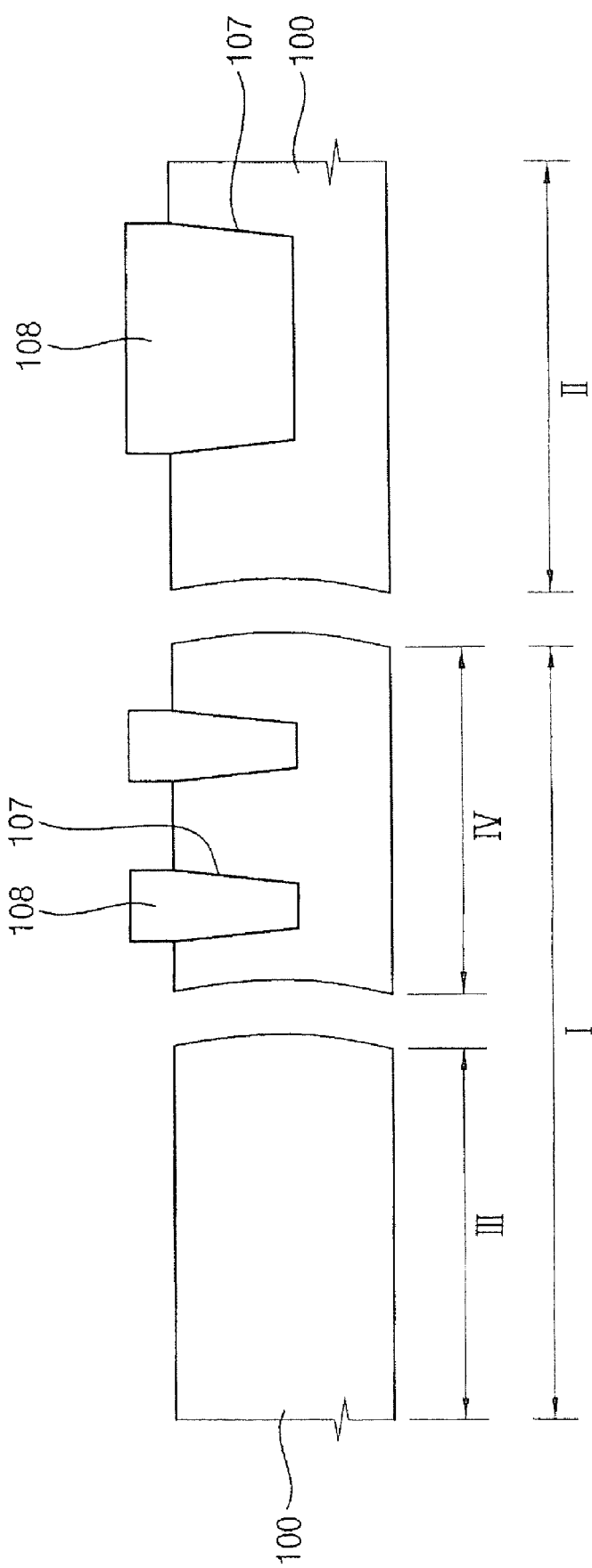

Referring to FIG. 6, the mask 106 is removed from the semiconductor substrate 100 so that the isolation layers 108 may protrude from an upper face of the semiconductor substrate 100. That is, upper faces of the isolation layers 108 may be higher than the upper face of the semiconductor substrate 100.

In some embodiments of the present invention, the mask 106 having the oxide film pattern 102 and the nitride film pattern 104 may be removed from the semiconductor substrate 100 by a wet etching process. The nitride film pattern 104 may be etched using an etching solution that includes a phosphoric acid, whereas the oxide film pattern 102 may be etched using an etching solution that includes hydrofluoric acid.

Figure 7:
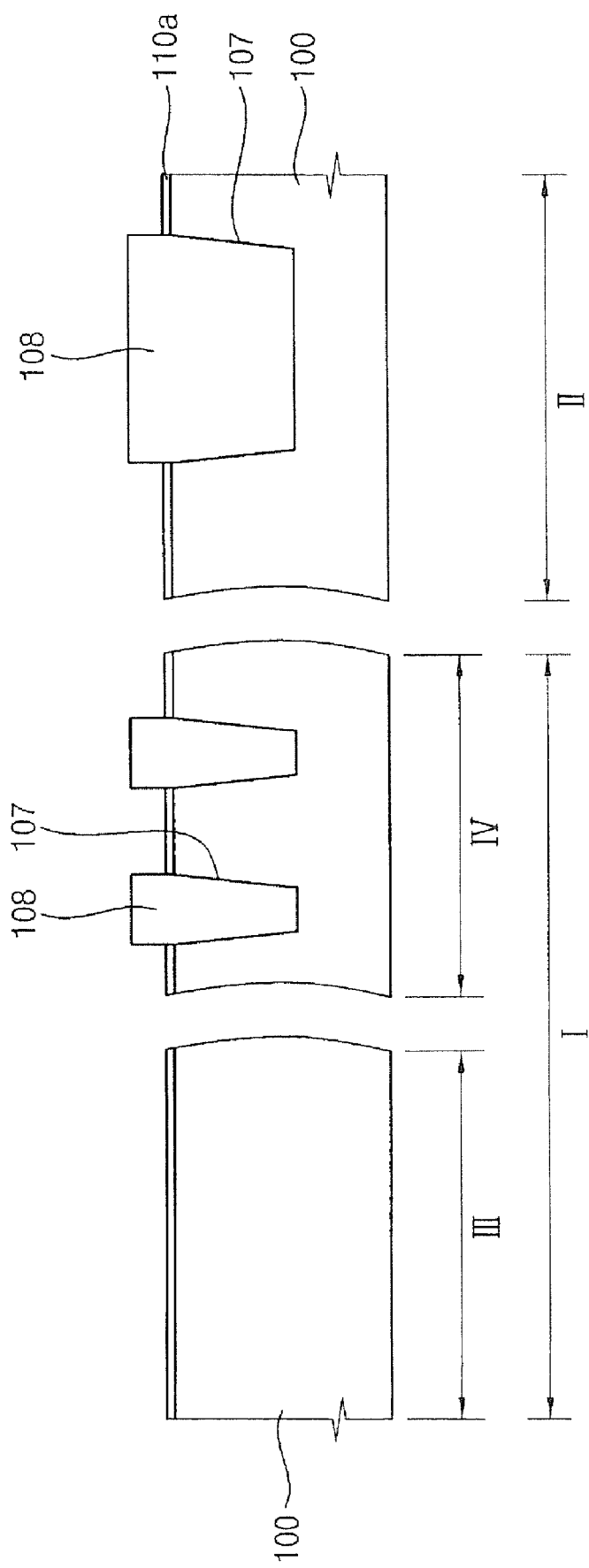

Referring to FIG. 7, a first layer 110a is formed on portions of the semiconductor substrate 100 that are exposed between the isolation layers 108. An upper face of the first layer 110a may be substantially lower than the upper face of each isolation layer 108. The first layer 110a may be formed, for example, using an oxide or a nitride. In some embodiments, the first layer 110a may be formed using silicon oxide or silicon nitride. The first layer 110a may be formed, for example, using silicon oxide obtained by a thermal oxidation process when the first layer 110a serves as a tunnel insulation layer in the semiconductor device.

In some embodiments of the present invention, the first layer 110a may be formed by a thermal oxidation process performed at a temperature of about 900° C. to about 1,200° C. In the thermal oxidation process, a temperature of a chamber in which the semiconductor substrate 100 is placed may gradually increase from a low temperature up to a temperature of about 900° C. to about 1,200° C. in order to reduce and/or prevent thermal damage to the semiconductor substrate 100. After forming the first layer 110a on the semiconductor substrate 100, the semiconductor substrate 100 may be gradually cooled in the chamber. In some embodiments, the first layer 110a may be formed using an oxidizing agent that includes an oxygen-containing gas or a water ($H_2O$) vapor.

The first layers 110a may have a thickness of about 20 Å to about 70 Å measured from the upper face of the semiconductor substrate 100. For example, a thickness of the first layer 110a in some embodiments may be in a range of about 20 Å to about 50 Å. In some embodiments, the first layer 110a may have a thickness of about 40 Å. As the first layer 110a is relatively thin, charges such as electrons may be effectively stored in a second layer pattern 112 (see FIG. 11) during a programming operation of the semiconductor device so that the semiconductor device may have improved programming characteristics.

Figure 8:
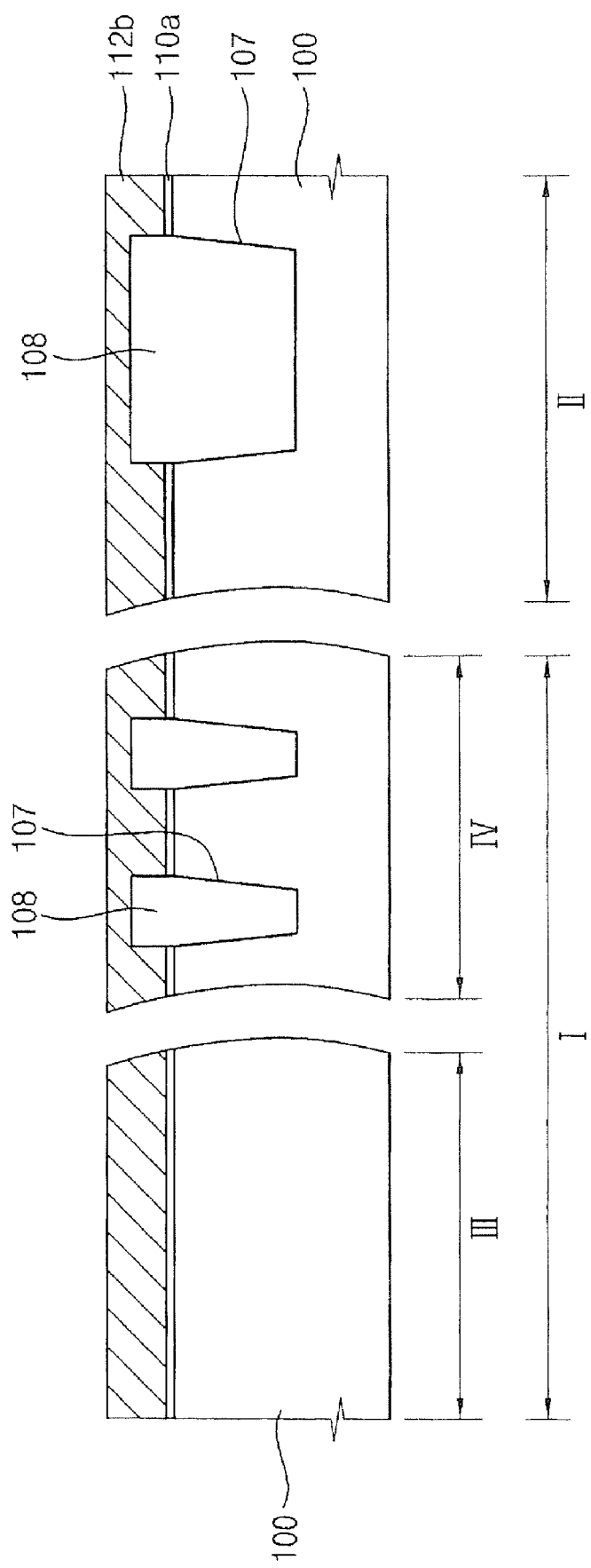

As illustrated in FIG. 8, a second layer 112b may then be formed on the first layer 110a to cover the isolation layers 108. The second layer 112b may be used to form a charge trapping layer pattern in the semiconductor device, as discussed in more detail herein.

In some embodiments of the present invention, the second layer 112b may be formed using a nitride such as silicon nitride. The second layer 112b may be formed by a sputtering process, a CVD process, an atomic layer deposition (ALD) process, etc. In certain embodiments, the second layer 112b may be formed by a CVD process using silicon nitride. For example, the second layer 112b may be formed using a reaction gas including a hexadichloro silane gas and an ammonia gas during a CVD process performed at a temperature of about 700° C. to about 800° C.

The second layer 112b may have a thickness of about 300 Å to about 500 Å as measured from the upper face of the first layer 110a. Thus, a thickness ratio between the first layer 110a and the second layer 112b may be in a range of about 1.0:4.3 to about 1.0:25.0. For example, the thickness of the second layer 112b may be in a range of about 200 Å to about 400 Å. The second layer 112b may fill the gaps between adjacent isolation layers 108.

Figure 9:
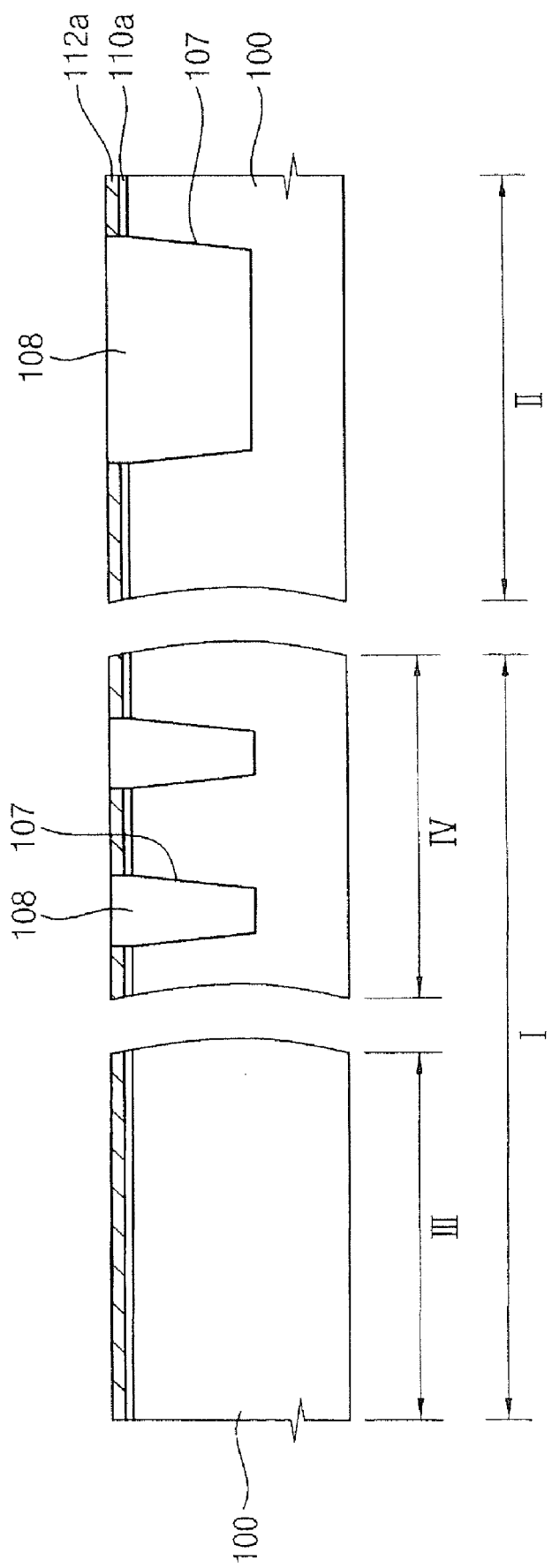

As illustrated in FIG. 9, the second layer 112b may be partially etched to form a preliminary second layer pattern 112a on the first layer 110a. The preliminary second layer pattern 112a may be formed, for example, by a photolithography process. As shown in FIG. 9, the preliminary second layer pattern 112a may be located between adjacent isolation layers 108. The preliminary second layer pattern 112a may have a thickness that is substantially thicker than the thickness of the first layer 110a.

In some embodiments of the present invention, the upper face of the preliminary second layer pattern 112a may have a height that is substantially the same as, or substantially lower than, the height of each of the isolation layers 108. In other words, a total thickness of the first layer 110a and the preliminary second layer pattern 112a may be substantially the same as, or less than, the thickness of the portions of the isolation layers 108 that extend above the upper surface of the substrate 100.

In some embodiments of the present invention, the preliminary second layer pattern 112a may have a thickness of about 50 Å to about 150 Å measured from the upper face of the first layer 110a. Accordingly, a thickness ratio between the second layer 112b and the preliminary second layer pattern 112a may be in a range of about 1.0:0.1 to about 1.0:0.5. Additionally, a thickness ratio between the first layer 110a and the preliminary second layer pattern 112a may be in a range of about 1.0:0.7 to about 1.0:7.5. For example, the thickness of the preliminary second layer pattern 112a may be in a range of about 60 Å to about 120 Å. In one specific embodiment, the preliminary second layer pattern 112a may have a thickness of about 90 Å.

The preliminary second layer pattern 112a may be formed, for example, by a dry etching process, a wet etching process, a CMP process, etc.

In one wet etching process for forming the preliminary second layer pattern 112a according to embodiments of the present invention, the semiconductor substrate 100 may be loaded in an etching chamber, and then an etching solution may be deposited onto the second layer 112b. Thus, the second layer 112b may be isotropically etched to form the preliminary second layer pattern 112a on the first layer 110a. When the second layer 112b includes silicon nitride, the etching solution employed in the wet etching process may include, for example, about 80 percent to about 90 percent by weight of a phosphoric acid solution based on a total weight of the etching solution. The etching solution may have a temperature, for example, of about 130° C. to about 180° C. during the wet etching process. When the isolation layer 108 includes silicon oxide and the second layer 112b includes silicon nitride, the etching solution may have an etching selectivity between the isolation layer 108 and the second layer 112b in a range of about 1:50 to about 1:100. For example, the etching solution may etch the second layer 112b at an etching rate of about 50 Å/minute to about 70 Å/minute, whereas the etching solution may etch the isolation layer 108 at an etching rate of 0.5 Å/minute to about 1.0 Å/minute. Thus, the thickness of the preliminary second layer pattern 112a may be desirably adjusted by employing proper etching conditions such as the composition of the etching solution, the etching temperature, etc.

In a dry etching process for forming the preliminary second layer pattern 112a according to some embodiments of the present invention, the semiconductor substrate 100 may be loaded in a plasma etching chamber, and then a process gas in the etching chamber may be changed into plasma by a remote plasma process. That is, the dry etching process may include a plasma etching process. The process gas may include an etching gas and a control gas. The etching gas may include, for example, a tetrafluoromethane ($CF_4$) gas, a hydrogen fluoride (HF) gas, a difluoromethane ($CH_2F_2$) gas, etc. For example, in some embodiments, the etching gas may include a tetrafluoromethane ($CF_4$) gas and a hydrogen fluoride (HF) gas. The control gas may include a hydrogen ($H_2$) gas, water ($H_2O$) vapor, an oxygen ($O_2$) gas, a nitrogen ($N_2$) gas, an argon (Ar) gas, etc. For example, in certain embodiments, the control gas may include an oxygen ($O_2$) gas and a nitrogen ($N_2$) gas. The plasma may include hydrogen radicals (H*) and/or fluorine radicals (F*). The second layer 112b may be etched using the plasma to form the preliminary second layer pattern 112a on the first layer 110a. The preliminary second layer pattern 112a may be formed under processing conditions that include, for example, an RF power of about 350 W to about 450 W, a temperature of about 15° C. to about 35° C., and a pressure of about 40 Pa to about 100 Pa. In the dry etching process, an etching selectivity between the isolation layer 108 and the second layer 112b may be in a range of about 1:30 to about 1:200. This etching selectivity may be desirably adjusted by controlling the processing conditions such as flow rates of the gases, the RF power, the temperature, the pressure, etc. For example, the second layer 112b may be etched by an etching rate of about 200 Å/minute to about 600 Å/minute, whereas the isolation layer 108 may be etched by an etching rate of about 4 Å/minute to about 7 Å/minute in the plasma etching process. Hence, the preliminary second layer pattern 112a may have a desired thickness by adjusting the processing conditions of the dry etching process.

In a CMP process for forming the preliminary second layer pattern 112a according to some embodiments of the present invention, the semiconductor substrate 100 may be loaded beneath a polishing head of a CMP apparatus. The second layer 112b may make contact with a polishing pad of the CMP apparatus, and then the second layer 112b may be polished using a slurry composition provided between the polishing pad and the second layer 112b. When the second layer 112b includes silicon nitride, the slurry composition for etching silicon nitride may be used. Here, the slurry composition may include an abrasive, an additive and a solvent. For example, the abrasive in the slurry composition may include a metal oxide, silicon oxide and/or cerium oxide. The additive in the slurry composition may include, for example, a pH controlling agent, an inhabitant for reducing an etching rate of oxide, a non-ionic surfactant, etc. The solvent in the slurry composition may include water. In the CMP process for forming the preliminary second layer pattern 112a, a polishing selectivity between the isolation layer 108 and the second layer 112b may be in a range of about 1:20 to about 1:40. For example, the second layer 112b may be removed by a polishing rate of about 1,000 Å/minute to about 1,200 Å/minute, whereas the isolation layer 108 may be removed at a polishing rate of about 30 Å/minute to about 50 Å/minute. Therefore, the preliminary second layer pattern 112a may have a desired thickness by adjusting processing conditions of the CMP process such as the slurry composition, rotation speeds of the polishing head and the polishing pad.

Figure 10:
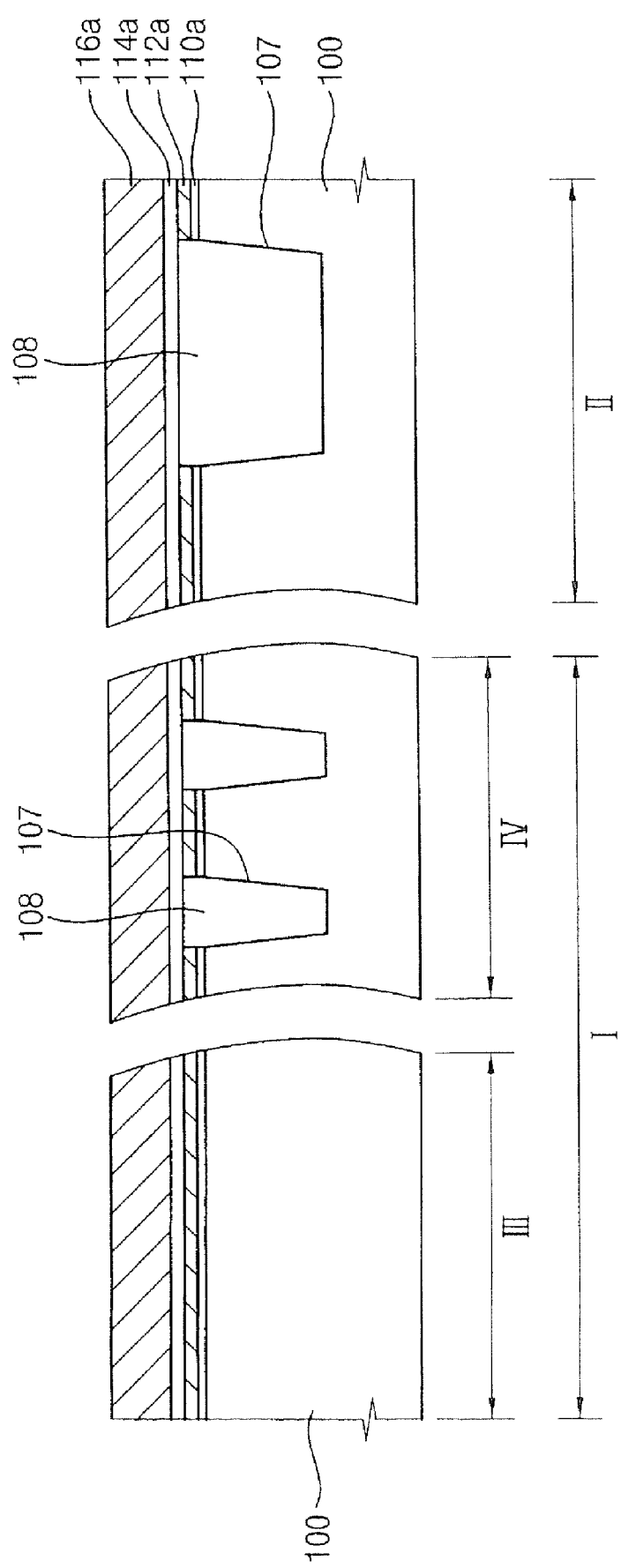

Referring to FIG. 10, a third layer 114a is formed on the preliminary second layer pattern 112a and the isolation layers 108. The third layer 114a may serve as a blocking layer pattern. The third layer 114a may be formed using an oxide or a metal oxide. For example, the third layer 114a may be formed using silicon oxide, hafnium oxide, titanium oxide, tantalum oxide, etc. The third layer 114a may have a dielectric constant that is substantially higher than the dielectric constant of the first layer 110a. The third layer 114a may have a thickness of, for example, about 30 Å to about 70 Å. In some embodiments, the thickness of the third layer 114a may be in a range of about 35 Å to about 45 Å. In certain embodiments, the third layer 114a may have a thickness of about 40 Å.

In some embodiments of the present invention, the third layer 114a may be formed by a radical oxidation process or a CVD process when the third layer 114a includes silicon oxide. In other embodiments, the third layer 114a may be formed by a molecular beam epitaxial growth process, a sputtering process, a CVD process or an ALD process when the third layer 114a includes a metal oxide.

In one ALD process for forming the third layer 114a according to certain embodiments of the present invention, the semiconductor substrate 100 may be loaded into a chamber having a temperature of, for example, about 200° C. to about 500° C. and a pressure of about 0.3 Torr to about 3.0 Torr. A precursor including a metal may be provided onto the preliminary second layer pattern 112a and the isolation layer 108 for about 0.5 seconds to about 3.0 seconds. Examples of the metal used in the precursor may include hafnium, titanium, tantalum, etc. When the precursor includes hafnium, the precursor may comprise, for example, tetrakis-ethyl-methyl-amino-hafnium (TEMAH; $Hf[NC_2H_5CH_3]_4$). Some portions of the precursor may be chemically absorbed onto the preliminary second layer pattern 112a and the isolation layer 108. Other portions of the precursor may be physically absorbed onto the preliminary second layer pattern 112a and the isolation layer 108, or may drift in the chamber. A first purge gas may be introduced into the chamber so as to remove the physically absorbed portion of the precursor and the drifting portion of the precursor from the chamber. The first purge gas may include an inactive gas such as an argon (Ar) gas, a helium (He) gas, a nitrogen ($N_2$) gas, etc. Thus, an absorption film may be formed on the preliminary second layer pattern 112a and the isolation layer 108. An oxidizing agent may be provided onto the absorption film for about 1.0 second to about 7.0 seconds. As a result, a metal oxide film may be formed on the preliminary second layer pattern 112a and the isolation layer 108 in accordance with a reaction between the absorption film and the oxidizing agent. The oxidizing agent may include, for example, an oxygen gas or an ozone gas. A second purge gas may be introduced into the chamber in order to remove any unreacted oxidizing agent from the chamber. By performing the above-described cycle of the ALD process at least once, the third layer 114a may be formed on the preliminary second layer pattern 112a and the isolation layer 108.

A fourth layer 116a is formed on the third layer 114a. The fourth layer 116a may serve as a gate electrode in the semiconductor device. The fourth layer 116a may be formed using a conductive material. In some embodiments, the fourth layer 116a may be formed using polysilicon doped with impurities. In other embodiments, the fourth layer 116a may be formed using a metal having a work function above about 4.0 eV. For example, the fourth layer 116a may be formed using titanium, tantalum, aluminum or a combination thereof.

Figure 11:
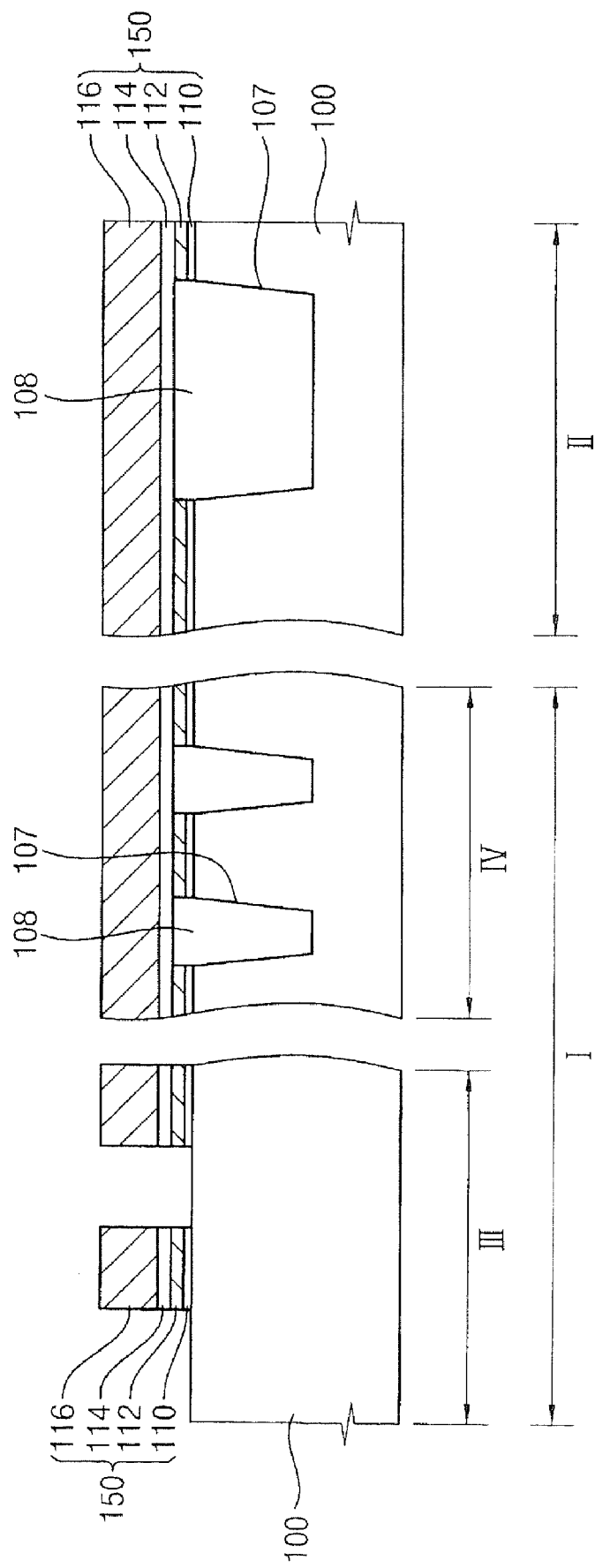

Referring to FIG. 11, after forming the first layer 110a, the preliminary second layer pattern 112a, the third layer 114a and the fourth layer 116a may be partially etched to form a gate structure 150 on the semiconductor substrate 100. The gate stricture 150 may include a first layer pattern 110, a second layer pattern 112, a third layer pattern 114 and a fourth layer pattern 116. In some embodiments, the first layer pattern 110, the second layer pattern 112, the third layer pattern 114 and the fourth layer pattern 116 may correspond to the tunnel insulation layer pattern, the charge trapping layer pattern, the blocking layer pattern and the gate electrode in the semiconductor device when the semiconductor device corresponds to a SONOS type non-volatile semiconductor device.

In some embodiments of the present invention, a photoresist pattern may be formed on the fourth layer 116a, and then the fourth layer 116a, the third layer 114a, the preliminary second layer pattern 112a and the first layer 110a may be partially etched using the photoresist pattern as an etching mask to form the gate structure having the first layer pattern 110, the second layer pattern 112, the third layer pattern 114 and the fourth layer pattern 116 on the semiconductor substrate 100.

In some embodiments of the present invention, impurities may be implanted into portions of the semiconductor substrate 100 adjacent to the gate structure 150 using the photoresist pattern as an ion implantation mask. Hence, source/drain regions 130 may be formed at the portions of the semiconductor substrate 100 adjacent to the gate structure 150. When the source/drain regions 130 are formed adjacent to the gate structure 150, a channel region 132 may be formed in the semiconductor substrate 100 beneath the gate structure 150. The photoresist pattern may be removed from the gate structure 150 by, for example, an ashing process and/or a stripping process.

Since the second layer patterns 112 in adjacent unit cells may be separated from each other along a direction substantially horizontal to the semiconductor substrate 100, lateral migration of the charges stored in the second layer patterns 112 may be reduced or prevented. Therefore, the semiconductor device may have enhanced electrical characteristics.

According to embodiments of the present invention, a semiconductor device such as, for example, a SONOS type non-volatile semiconductor device, may include unit cells having charge trapping layer patterns which are separated from the charge trapping layers of adjacent unit cells. These semiconductor devices may have improved electrical characteristics because lateral migration of charges between adjacent charge trapping layer patterns may be reduced and/or prevented. Additionally, damage to the charge trapping layer during etching process(es) that are used to form the isolation layer may also be reduced and/or prevented. Therefore, the electrical characteristics of the semiconductor device may be enhanced, and the degree of integration of the semiconductor device may be improved.

While embodiments of the above invention have generally been described with reference to a single unit cell of the semiconductor device and/or with respect to two adjacent unit cells of the semiconductor device, it will be appreciated that the semiconductor device will typically include a large number of unit cells, which may be (and typically are) disposed in rows and columns. Thus, while the above-description (and the following claims) often refer to only one or two gate electrodes, trenches, isolation patterns, etc., it will be appreciated that typically the semiconductor device will include a large number of these elements that form a large number of unit cells.

The foregoing is illustrative of the present invention and is not to be construed as limiting thereof. Although a few embodiments of the present invention have been described, those skilled in the art will readily appreciate that many modifications are possible without materially departing from the novel teachings and advantages of the present invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a semiconductor device, the method comprising:
    forming a trench in a substrate;
    forming an isolation layer in the trench such that the isolation layer protrudes from the substrate;
    forming a first layer on the substrate exposed by the isolation layer;
    forming a preliminary second layer pattern on the first layer, wherein an upper face of the preliminary second layer pattern is at a level above the substrate that is substantially lower than, or substantially equal to, a level above the substrate of an upper face of the isolation layer;
    forming a third layer on the preliminary second layer and the isolation layer;
    forming a fourth layer on the third layer;
    partially etching the fourth layer, the third layer, the preliminary second layer pattern and the first layer to form a gate structure on the substrate, wherein the gate structure comprises a first layer pattern, a second layer pattern, a third layer pattern and a fourth layer pattern; and
    forming source/drain regions at portions of the substrate adjacent to the gate structure.

2. The method of claim 1, wherein the first layer pattern, the second layer pattern, the third layer pattern and the fourth layer pattern correspond to a tunnel insulation layer pattern, a charge trapping layer pattern, a blocking layer pattern and a gate electrode, respectively.

3. The method of claim 1, wherein a thickness ratio between the first layer and the preliminary second layer pattern is in a range of about 1.0:0.7 to about 1.0:7.5.

4. The method of claim 1, wherein forming the trench and forming the isolation layer comprise:
    forming a mask on the substrate;
    etching a portion of the substrate using the mask to form the trench;
    forming an oxide layer in the trench and on the mask;
    partially removing the oxide layer to expose the mask; and
    removing the mask from the substrate.

5. The method of claim 4, wherein forming the mask on the substrate comprises:
    forming an oxide film on the substrate;
    forming a nitride film on the oxide film; and
    partially etching the nitride and the oxide films to form the mask that includes a nitride film pattern on an oxide film pattern.

6. The method of claim 1, wherein the first layer is formed by a thermal oxidation process using an oxidizing agent that includes an oxygen-containing gas or a water vapor.

7. The method of claim 1, wherein forming the preliminary second layer pattern comprises:
    forming a second layer on the first layer and the isolation layer; and partially removing the second layer to form the preliminary second layer pattern, wherein the preliminary second layer pattern is only on the first layer.

8. The method of claim 7, wherein the second layer includes silicon nitride.

9. The method of claim 7, wherein a thickness ratio between the second layer and the preliminary second layer pattern is in a range of about 1.0:0.1 to about 1.0:0.5.

10. The method of claim 7, wherein partially removing the second layer to form the preliminary second layer pattern comprises wet etching the second layer using an etching solution that includes a phosphoric acid solution.

11. The method of claim 10, wherein an etching selectivity between the isolation layer and the second layer during wet etching the second layer is in a range of about 1:50 to about 1:100.

12. The method of claim 7, wherein partially removing the second layer to form the preliminary second layer pattern comprises dry etching the second layer via a plasma etching process.

13. The method of claim 12, wherein an etching selectivity between the isolation layer and the second layer during dry etching the second layer is in a range of about 1:30 to about 1:200.

14. The method of claim 7, wherein partially removing the second layer to form the preliminary second layer pattern comprises performing a chemical mechanical polishing (CMP) process on the second layer.

15. The method of claim 14, wherein the CMP process is performed using a slurry composition that includes an abrasive containing metal oxide, silicon oxide or cerium oxide.

16. The method of claim 14, wherein a polishing selectivity between the isolation layer and the second layer is in a range of about 1:20 to about 1:40.

17. The method of claim 1, wherein the first layer is formed using silicon oxide or silicon nitride.

18. The method of claim 1, wherein the third layer is formed using silicon oxide or metal oxide.

19. The method of claim 18, wherein the third layer is formed by a radical oxidation process, a chemical vapor deposition process, a molecular beam epitaxial growth process, a sputtering process or an atomic layer deposition process.

20. The method of claim 1, wherein the fourth layer is formed using polysilicon or metal.

21. A method of making a silicon-oxide-nitride-oxide-semiconductor (SONOS) type non-volatile semiconductor device, the method comprising:

forming a trench in a substrate;
forming an isolation pattern in the trench, wherein the isolation pattern protrudes above an upper face of the substrate;
forming a tunnel insulation layer on the substrate exposed by the isolation pattern such that a height of an upper face of the tunnel insulation layer is substantially lower than a height of the portions of the isolation pattern that protrude above the upper face of the substrate;
forming a charge trapping layer pattern on the tunnel insulation layer;
forming a blocking layer on the charge trapping layer pattern and the isolation pattern;
forming a gate electrode layer on the blocking layer;
partially etching the gate electrode layer, the blocking layer, the charge trapping layer pattern and the tunnel insulation layer to form a gate structure on the substrate; and
forming source/drain regions at portions of the substrate adjacent to the gate structure.

22. The method of claim 21, wherein forming the trench and forming the isolation pattern comprise:

forming a mask on the substrate;
etching a portion of the substrate using the mask to form the trench;
forming an oxide layer in the trench and on the mask;
forming the isolation pattern by partially removing the oxide layer to expose the mask; and
removing the mask from the substrate.

23. The method of claim 22, wherein a height of an upper face of the charge trapping layer pattern above the substrate is lower than or equal to a height of the portions of the isolation pattern that protrude above the upper face of the substrate.

24. The method of claim 23, wherein a thickness ratio between the tunnel insulation layer and the charge trapping layer pattern is in a range of about 1.0:0.7 to about 1.0:7.5.

25. The method of claim 24, wherein forming the charge trapping layer pattern comprises:

forming a second layer on the tunnel insulation layer and the isolation pattern; and
removing at least the portions of the second layer that are on the isolation pattern to form the charge trapping layer pattern.

26. The method of claim 25, wherein a thickness ratio between the second layer and the charge trapping layer pattern is in a range of about 1.0:0.1 to about 1.0:0.5.

* * * * *